(12) United States Patent
Chen et al.

(10) Patent No.: US 6,482,748 B1
(45) Date of Patent: Nov. 19, 2002

(54) POLY GATE SILICIDE INSPECTION BY BACK END ETCHING

(75) Inventors: Jung-Chin Chen, Chu-Tung (TW); Cheng-Han Lee, Kinmeu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/389,883

(22) Filed: Sep. 3, 1999

(51) Int. Cl.[7] ............................................. H01L 21/302
(52) U.S. Cl. .................. 438/745; 438/745; 438/753; 438/754; 438/756; 438/692; 438/693
(58) Field of Search ................ 438/745, 753, 438/754, 756, 692, 693

(56) References Cited

U.S. PATENT DOCUMENTS

| | | | |
|---|---|---|---|
| 4,991,925 A | * 2/1991 | Mitchell et al. | 350/96.15 |
| 5,110,760 A | * 5/1992 | Hsu | 437/180 |
| 5,244,817 A | * 9/1993 | Hawkins et al. | 437/2 |
| 5,270,236 A | * 12/1993 | Rosner | 437/48 |
| 5,716,494 A | * 2/1998 | Imani et al. | 156/643.1 |
| 5,736,863 A | * 4/1998 | Liu | 324/765 |
| 5,767,021 A | * 6/1998 | Imani et al. | 438/719 |
| 5,888,906 A | * 3/1999 | Sandhu et al. | 438/706 |
| 5,891,784 A | * 4/1999 | Cheung et al. | 438/303 |
| 5,972,123 A | * 10/1999 | Verhaverbeke | 134/3 |
| 5,981,454 A | * 11/1999 | Small | 510/175 |

* cited by examiner

Primary Examiner—Robert Kunemund
Assistant Examiner—Charlotte A. Brown
(74) Attorney, Agent, or Firm—George O. Saile; Stephen B. Ackerman

(57) ABSTRACT

Under the first embodiment of the invention, back-end etching is applied to the specimen that needs to be inspected. Its surface is cleaned and mounted on a glass surface with the surface of the poly gate silicide that needs to be inspected being in contact with the surface of the glass. The exposed surface of the sample that is to be examined contains silicon, this silicon is removed. The gate oxide is then removed followed by the removal of the remaining poly of the gate structure. The second embodiment of the invention addresses poly gate inspection by enhanced (top surface of the gate electrode) gas etching of the gate electrode to remove gate oxide and silicon remains from the environment of the silicide. The specimen is etched back to the contact layer using a conventional Chemical Mechanical Polishing (CMP) process. The polished surface of the specimen is next exposed to XeF2, which selectively removes the oxide while the silicide remains in place.

10 Claims, 3 Drawing Sheets

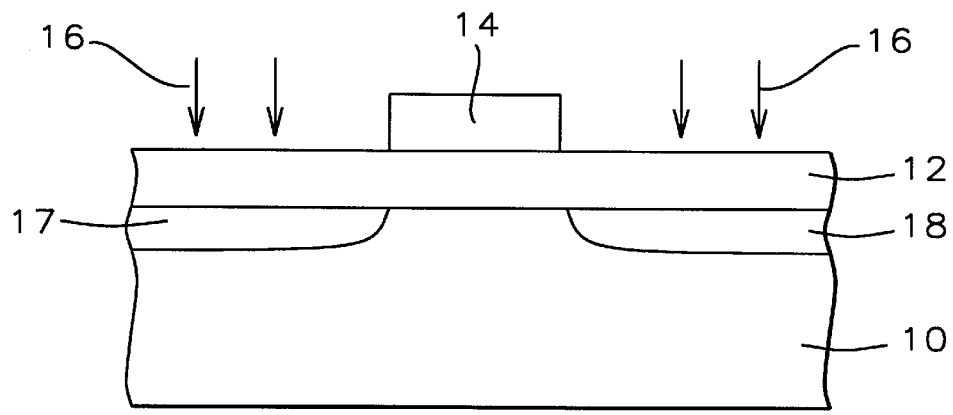
FIG. 1a – Prior Art
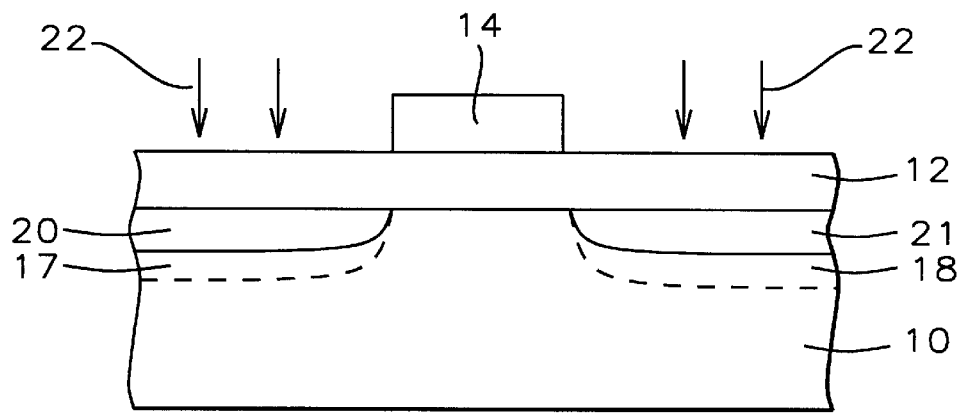
FIG. 1b – Prior Art
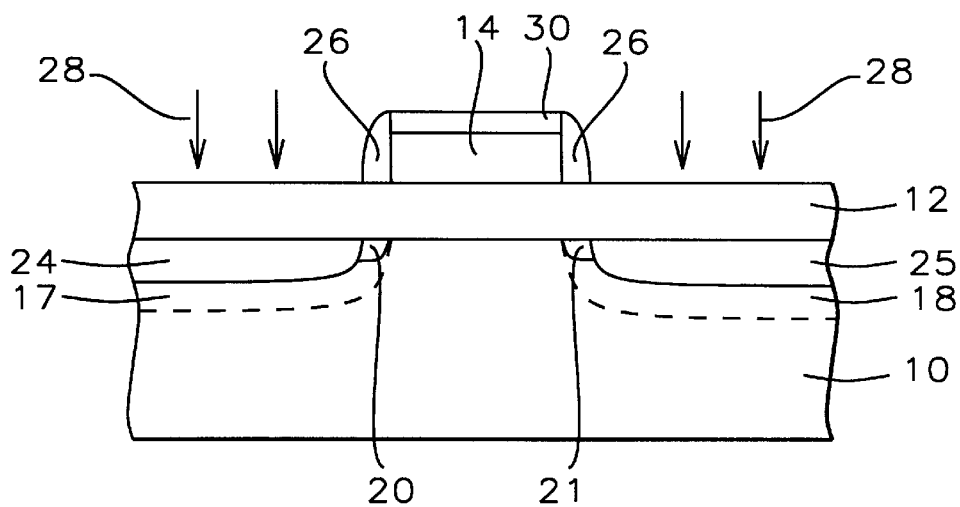
FIG. 1c – Prior Art

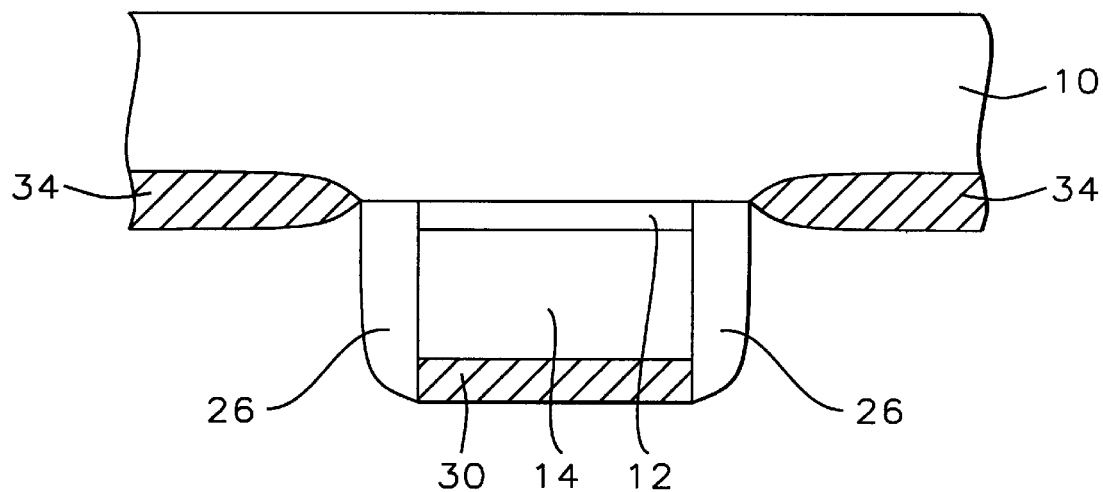
*FIG. 1d – Prior Art*
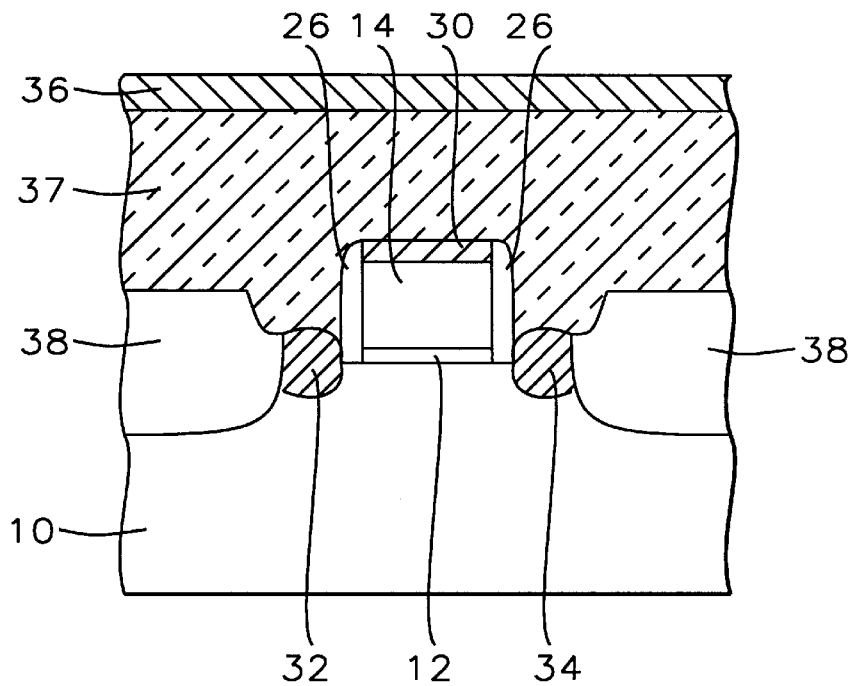
*FIG. 1e – Prior Art*

POLY GATE SILICIDE INSPECTION BY BACK END ETCHING

BACKGROUND OF THE INVENTION (1) Field of the Invention

The invention relates to the fabrication of integrated circuit devices, and more particularly, to a method of inspecting the continuity of created poly gate silicide.

(2) Description of the Prior Art

A key aspect of the manufacturing of semiconductor devices and the performance improvements that are being made to these devices has, for many years, been device miniaturization. Smaller and denser semiconductor devices provide improved device performance together with increased functional capability of the device. This continuing increase in device miniaturization however continues to pose new problems of device design and manufacturing such as increased parasitic capacitance, increased relative impact of device contact resistance and ever increasing demands on the ability to create small and closely spaced device features. The problem of reducing contact resistance is in the art addressed by the use of silicides. For very small modern silicon devices, which are sub-micron, sub-half-micron, and even sub-quarter-micron, conventional photolithographic technique for patterning contacts will not meet the required tolerance of critical dimensions. The method of self-aligned silicide (salicide) formation, which self-registers with the contacts at the top of the polysilicon gate, the source and the drain, helps solve the problem of critical dimension tolerance. Salicides have thus become almost universal in todays high-density MOSFET (Metal-Oxide-Semiconductor Field-Effect Transistors) devices. A metal silicide layer is for instance used on the gate electrode of the Field Effect Transistor (FET) to substantially reduce the sheet resistance of the polysilicon gate electrode. In forming a FET, the active region on the surface of the substrate in which the FET is being created is typically bounded by field oxide regions. A layer of thin oxide is formed on the substrate active device region over which layer of polysilicon is formed. The polysilicon layer is then masked and both the exposed polysilicon and the underlying thin oxide are etched to define a poly-silicon gate region separated from the substrate by thin gate oxide. A self-aligned implant of N-type dopant then forms lightly doped diffusion (LDD) source/drain regions in the substrate as a first phase in forming the substrate N+source/drain regions of the MOSFET. After the formation of oxide sidewall spacers on the sidewalls of the polysilicon gate and of the gate oxide, a second N+implant is performed to set the conductivity of the gate region to a desired level and to complete the N+ source/drain regions. Titanium is then deposited on the exposed upper surfaces of the N+ source/drain regions and the polysilicon gate region and annealed (sintered), thereby causing the titanium to react with the underlying N+ silicon of the substrate source/drain regions and the doped polysilicon gate to form titanium salicide on these surfaces. A layer of dielectric material, typically silicon oxide, is then formed. Contact openings are etched in the dielectric and a metalization layer is formed to provide contacts to the salicide on the source/drain regions and on the polysilicon gate.

The above-described MOSFET fabrication technique suffers from potential problems in the formation of source/drain regions. First, selective growth of the salicide needed for good contacts with the metalization layer requires a reaction between the titanium and underlying silicon. Therefore, the titanium must be formed on the N+ source/drain regions that must be wide enough to accommodate the photolithographic limitations in the contact opening; this results in a wider device. Also, since silicon is consumed in this process, the junction depth of the N+ source/drain regions is difficult to control and dopant depletion can occur in these regions.

Furthermore, formation of the deep, heavily doped N+ junction for the source/drain regions can result in dopant diffusion under the gate region thereby reducing the effective channel length of the MOSFET, i.e. the so-called "short channel effect". Yet another problem that can be experienced in the above-indicated formation of the salicide regions is that it is difficult to create low sheet resistance silicide for sub-micron device features. This problem has been addressed by using not titanium but cobalt or nickel to interact with the underlying silicon and to thereby form the low resistance contact regions. Also, the polysilicon of the gate structure can be amorphized by ion implant thereby improving its sheet resistance. This latter approach can however result in crystalline damage to the silicon of the source/drain regions of the device.

The ability to achieve successful salicide formation is dependent on the integrity of the insulator spacers, on the sides of the polysilicon gate structure, during the salicide formation procedure. For example prior to metal deposition, native oxide on the exposed top surface of the polysilicon gate structure, as well as the top surface of the source and drain region, has to be removed, to allow the subsequent metal silicide formation to be successful. Native oxide will prevent the reaction between the metal and the exposed silicon surfaces during an anneal cycle. Therefore a buffered hydrofluoric acid procedure is used prior to metal deposition. However if, as a result of the buffered hydrofluoric acid metal pre-cleaning procedure, the insulator spacer (on the sides of the polysilicon gate structure) becomes defective or significantly thinned, thereby exposing polysilicon, the formation of unwanted metal silicide or bridging of the metal silicide can occur on the sides of the polysilicon gate structure. This results in gate to substrate shorting or leakage.

A number of different approaches have been advocated in the art for the formation of low resistance contact regions to the gate electrode and source/drain regions of the device, all of these approaches must be provided with a method of close inspection and monitoring of the results that are obtained while using these methods.

In the recent past, Scanning Electron Microscopes (SEM's) and Transmission Electron Microscopes (TEM's) have been used extensively for visual inspection of created layers of silicide. These methods are however time consuming whereby furthermore only localized or narrow areas of the silicide can be observed at one time. Scanning over the entire surface of the created silicide therefor requires multiple adjustments over the surface that is being observed, making this process very time consuming and labor-intensive. This process is also rather cumbersome because using an SEM requires that the specimen that is being examined must be placed into a vacuum chamber where a focused electron beam strikes the area that is being examined. The surface region of the specimen that is being examined must be electrically grounded within the SEM, if such grounding is not provided electrons emitted by the electron beam accumulate on the surface that is being inspected causing severe distortions of this surface. Earlier SEM's were provided with relatively small chambers, which limited inspection to relatively small specimens. These specimens were typically mounted onto an aluminum pedestal using a conductive silver paste. Dependent on the type of surface that is being examined, this method can create considerable image distortion as a result of particle creation and distribution throughout the chamber. High resolution for this method of surface examination required high-energy beam accelerating voltages, further aggravating the problem of particle creation and thus image distortion. This problem has been addressed by disposing a thin layer of gold onto the surface that is being examined, thus providing a good conductive layer over this surface and thereby significantly improving surface resolution.

Current technology allows for the inspection of larger surfaces that can be inserted into the SEM. This method however remains time consuming and cumbersome. The application of a layer of gold creates a number of problems, which make that method unacceptable. The requirement of good surface resolution remains in force and is further emphasized by continuing decreases in device feature dimensions. This requirement brings with it the requirement for high energy beam accelerating voltages which is, as previously indicated, counter to the requirement of examining devices with deep sub-micron feature size. A method is therefore required for the inspection of silicide surfaces that does not entail the disadvantages that are implied in the existing methods of using the SEM or TEM inspection methods.

U.S. Pat. No. 5,110,760 (Hsu) and U.S. Pat. No. 5,891,784 (Cheung et al.) teach an etch in a gate silicide process using Xenon difluoride. However, these references differ from the exact process of the invention.

U.S. Pat. No. 5,736,863 (Liu) shows a SEM test method of an opening in an insulative layer.

U.S. Pat. No. 5,767,021 (Imai et al.) teaches a $XeF_2$ plasma etch process of a silicide and poly film.

U.S. Pat. No. 5,888,906 (Sandhu) and U.S. Pat. No. 5,716,494 (Imai et. al.) teach $XeF_2$ etch methods.

SUMMARY OF THE INVENTION

A principle objective of the invention is to provide a method of inspecting poly gate silicide formations.

Another objective of the invention is to simplify the inspection process required for the inspection of poly gate silicide formations.

Yet another objective of the invention is to provide a method of inspecting poly gate silicide formations whereby a larger surface area can be readily inspected.

A still further objective of the invention is to provide a method of inspecting poly gate silicide formations whereby attention can readily be shifted to areas that need further detailed inspection.

It is yet another objective of the invention to provide a method of inspecting poly gate silicide in a reduced cycle time.

It is yet another objective of the invention to simplify the preparation of the specimen for inspection of poly gate silicide.

In accordance with the objectives of the invention a new method is provided for the inspection of poly gate silicide.

The first embodiment of the invention addresses silicide inspection by back-end etching. The approach used under this embodiment is represented by the gate electrode cross section of FIG. 1d. Under the first embodiment of the invention, the specimen that needs to be inspected is surface cleaned and mounted on a glass surface with the surface of the poly gate silicide that needs to be inspected being in contact with the surface of the glass. Use is made of the high etch selectivity that exists between silicon or oxide and titanium silicide when using choline hydroxyde as an etchant. The exposed surface of the sample that is to be examined contains silicon, this silicon (initial thickness about 1 mm) is removed, and the gate oxide remains in place. The gate oxide is then removed followed by the removal of the gate poly, thereby leaving the silicide formation on the surface of the glass for detailed inspection. This inspection can take place using a SEM but without requiring the previously indicated steps of preparing a specimen for inspection since the formation of silicide is essentially the (only) substance remaining on the surface of the glass.

The second embodiment of the invention addresses poly gate silicide inspection by enhanced (top surface of the gate electrode) gas etching of the gate electrode to remove gate oxide and silicon remains from the environment of the silicide. The approach used under this embodiment is represented by the gate electrode cross section of FIG. 1e. Under the second embodiment of the invention, the specimen is not, as opposed to the first embodiment of the invention, mounted on a rigid surface of glass. The specimen is etched back to the contact layer, that is well into the layer of dielectric that has been deposited over the gate electrode, using a conventional Chemical Mechanical Polishing (CMP) process. The polished surface of the specimen is next exposed to $XeF_2$ which selectively removes the oxide while the silicide remains in place. The material that surrounds the silicide is thus removed leaving the silicide essentially in place and ready for further inspection.

BRIEF DESCRIPTION OF THE DRAWINGS

FIGS. 1a through 1e show a cross section of a gate electrode and its surrounding area, as follows:

FIG. 1a shows a cross section of a gate electrode on the surface of a silicon substrate.

FIG. 1b shows self-aligned lightly doped (LDD) regions formed in the surface of the substrate.

FIG. 1c shows the formation of gate spacers and source/drain regions for the gate electrode.

FIG. 1d shows the gate electrode in cross section with the poly gate silicide layer facing downwards. Also shown are the silicide contact regions for the source and drain regions respectively.

FIG. 1e shows a cross section of the gate electrode after the contact layers of silicide have been formed, a layer of dielectric has been deposited over the gate electrode while a layer of metal has been formed on the surface of the layer of dielectric.

DESCRIPTION OF THE PREFERRED EMBODIMENTS

Figure 2:
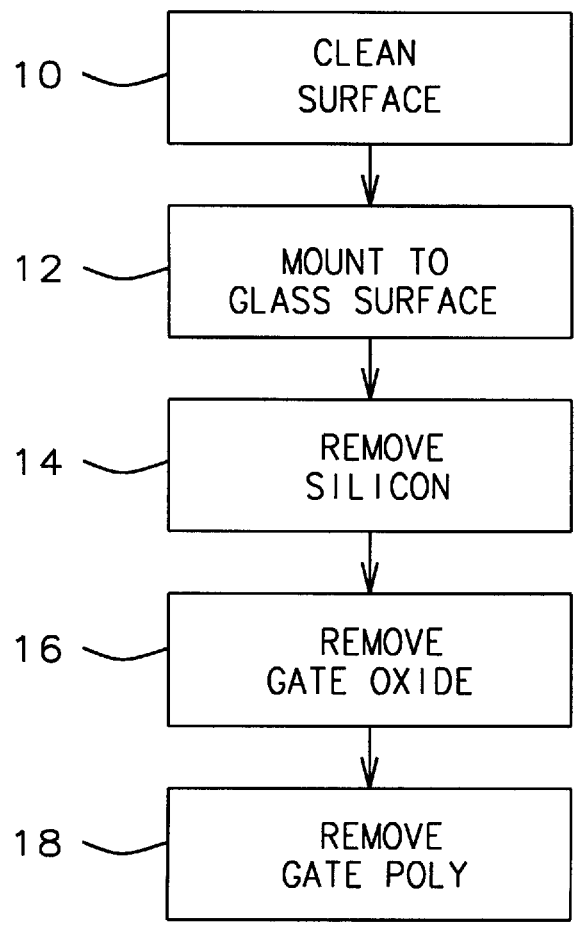
FIG. 2 is a flow chart of the processing steps that are required under the first embodiment of the invention to prepare the specimen for inspection.

Referring now specifically to FIGS. 1a through 1e, there is shown a cross section of a gate electrode and its surrounding area. The gate electrode is typically constructed on the surface of a monocrystalline silicon preferably having a crystal orientation of <100>, the background substrate dopant is of first conductivity type and preferably p-type, preferably with boron impurity with a concentration in the range of about 5E15 and 5E17 atoms/cm$^3$.

FIG. 1a shows a cross section of the gate electrode 14 on the surface of a silicon substrate 10. A layer of gate oxide 12 has been created over the surface of substrate 10, a layer 14 of polysilicon is deposited, patterned and etched back to form the gate electrode 14. P-type implant 16 forms deep lightly doped regions 17 (the source region) and 18 (the drain region) in the surface of the substrate 10, these regions are (due to the masking effect of the poly layer 14) self-aligned with the gate electrode 14. Dopant concentrations in regions 16 and 18 are higher than the dopant concentrations in the surrounding substrate 10.

FIG. 1b shows how the lightly doped (LDD) regions 20 and 21 are formed by performing an N-type implant 22 into substrate 10. This N-type implant has a shallower junction depth and a higher dopant concentration than the previously implanted regions 17 and 18 (FIG. 1a).

FIG. 1c shows the formation of gate spacers 26 on the sides of the gate electrode 14. By performing implant 28 the heavily doped regions 24 and 25 are created in the substrate 14. Silicide layers are created over the surface of the source/drain regions 24 and 25 and on the top surface 30 of the gate electrode 24. These silicide layers are, as previously indicated, used to interconnect the gate electrode and to connect the gate electrode to surrounding circuitry. The invention addresses the inspection of the layer 30 of silicide that is formed on the top surface of the gate electrode.

FIG. 1d shows the gate electrode in cross section with the poly gate silicide layer 30 facing downwards. Also shown are the silicide contact regions 32 and 34 for the source and drain regions respectively. The doping of the source/drain regions is not shown in FIG. 1d for reasons of clarity. It is essential to derive from the indicated structure of a gate electrode that the layers that must be removed under the first embodiment of the invention in order to access the poly gate silicide, that is layer 30, are the silicon 10 of the silicon substrate (including regions 32 and 34), the gate oxide layer 12 and the layer 14 of poly of the gate electrode structure. By mounting the surface silicide layer 30 of the specimen that is being examined on a stable surface and by removing the surrounding silicon 10, the gate oxide 12 and poly 14 thereby leaving the silicide 30 in place, the silicide can then be readily examined.

FIG. 1e shows a cross section of the gate electrode after the contact layers of silicide have been formed, a layer of dielectric has been deposited over the gate electrode while a layer of metal has been formed on the surface of the layer of dielectric. The doping of the source/drain regions is not shown in FIG. 1e for reasons of clarity. Shallow Trench Isolations (STI) regions 38 bound the active region of the gate electrode on the surface of the substrate 10. The gate oxide layer 12 is located under the gate poly layer 14. A silicide layer 30 is created to establish electrical contact with the gate electrode, silicide layers 32 and 34 are created for making electrical contact to the source and drain regions respectively. A layer 38 of dielectric has been deposited over the gate electrode and the surrounding STI regions 38, electrical contacts can be established between the silicide layers and, for instance, a layer 36 of metal conductor, by patterning and etching an opening through the layer 38 of dielectric and filling this opening with metal. This electrical contact has not been shown is FIG. 1e. It is clear from the cross section shown in FIG. 1e that, in order to access the silicide layer 30, the layer 36 of metal and the dielectric 38 overlying the silicide must be removed. This process of removal is accomplished under the second embodiment of the invention partially by means of CMP and partially by means of chemical etching.

Referring now specifically to FIG. 2, there is shown a flow chart of the processing steps that are required under the invention. The processing steps indicated under FIG. 2 can readily be followed by referring to the previously highlighted FIG. 1d.

FIG. 2, step 10 shows the preparation of the specimen for the step of mounting the specimen on a glass surface. The surface of the specimen that contains the gate electrode is thoroughly cleaned thereby removing all spurious materials from this surface that can have a negative impact on the analysis of the layer of silicide.

After the surface has been cleaned in this manner, the specimen is attached to a glass surface using adhesive glue, FIG. 2, Step 12. The specimen is mounted (glued or bonded) onto the surface of a glass pane in a position such that the silicide that is to be examined is in direct physical contact with this glass pane so that the bottom surface of the silicon (of the wafer on which the gate electrode was formed) is facing upwards. For the application that is shown, where the inspection occurs from the backside of the device, the layers 36 of metal and 38 of dielectric do not have to be removed. The layer of the device that is in contact with the glass is a passivation layer.

The cleaner that is used to clean the glass surface typically contains aceton, the cleaning agent is applied by vibrating in an ultrasonic cleaner in a clean-room environment. The glue that is used is an epoxy bond 110, mixed in are A/B components in the ratio of 10:1. The glue must be applied as thin as possible and still achieve the required bonding.

FIG. 2, step 14, indicates the removal of the silicon from the exposed surface. The original thickness of the layer of silicon (the substrate wafer) is about 1 mm, the process of essentially removing this silicon is a CMP process followed by a lapping process that reduces the silicon thickness to between about 5 and 10 um. The original silicon is removed by Chemical Mechanical Polishing (CMP) to a thickness of about 10,000 nm. After the process of CMP silicon removal, the specimen must be prepared for the removal of the balance of the silicon. For this purpose, a solution is prepared that contains choline and DI in the ratio of Choline : DI=1:10. The solution is heated to about 90 degrees C. after which the specimen is dipped into the solution. In this formula, choline hydroxide has the chemical composition of $HOCH_2CH_2N(CH)_3OH$ with an etch selectivity of 10000:1 for Si: $SiO_2$ and a typical etch rate of 25000 nm/hour. As such, choline hydroxide exhibits a slow etch rate for this application while it is also prone to a high viscosity.

The slow etch rate serves provides a margin of safety when preparing the sample, an overetch does thereby no damage. The high viscosity of the choline hydroxide is not an advantage, choline hydroxide typically must be diluted while after the etch has been completed the choline hydroxide needs to be removed by further cleaning.

As a final step in the removal of the silicon the specimen is soaked in water for a period of about 5 minutes thereby removing all remnants of silicon from the specimen.

The gate oxide must next be removed, FIG. 2, step 16. This is accomplished by dipping the specimen in slope for the duration of between about 3 and 5 seconds. Slope is a chemical compound containing HF, BOE, DI water and $CH_3COOH$.

The ratio in which these ingredients are mixed is as follows: HF: BOE: DI WATER: $CH_3COOH$=1:15:3:10.

The temperature of the slope is not critical and can be ambient or room temperature. The dip lasts for between about 3 and 5 seconds. The dip is a "static" dip and does not require any agitation during the dip.

FIG. 2, step 18 shows the step of removing the gate poly. This step requires that the specimen be dipped in choline.

Choline has a chemical composition of $HOCH_2CH_2N(CH)_3OH$, the temperature of the choline should be between about 80 and 90 degrees C. The dip is required to last for about 3 minutes and is an agitated dip.

After this step has been completed, the specimen is ready for the analysis of the silicide.

Figure 3:
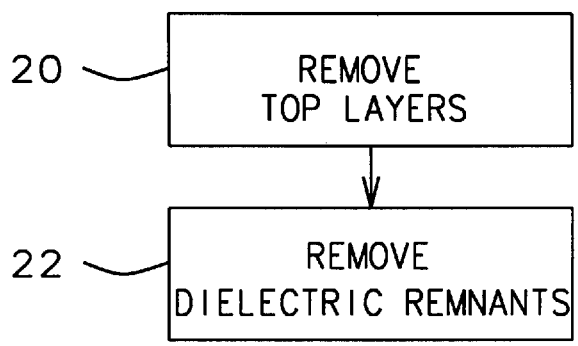
FIG. 3 is a flow chart of the processing steps that are required under the second embodiment of the invention to prepare the specimen for inspection.

FIG. 3 shows a flow chart of the processing steps that are required under the second embodiment of the invention to prepare the specimen for inspection. The processing steps indicated under FIG. 3 can readily be followed by referring to the previously highlighted FIG. 1e.

The second embodiment of the invention specifically addresses the Prior Art problems experienced during silicide inspection whereby conventional layer strip solution of HF etches the silicide thereby eliminating the possibility of inspecting the silicide.

FIG. 3, step 20, indicates the process of removing the bulk of the material that is above the surface of the poly gate silicide layer, that is any metal that may have been deposited (such as layer 36, FIG. 1e) and a major portion of the dielectric (layer 38, FIG. 1e) that has been deposited over the gate electrode. This removal applies conventional CMP processes and is continued until the contact layer of the silicide (layer 30, FIG. 1e) is reached.

FIG. 3, step 22 shows the removal of the remnants of the dielectric from the surface of the silicide. This processing step is performed using $XeF_2$ as an etchant and results in the selective removal of oxide or any other dielectric remnants from the surface of the poly gate silicide. This etch can proceed to the point where the silicide is becomes visible. The bright metallic surface of the silicide makes this detection simple and direct. This etch will also remove silicide remnants that may have been left in place during previous processing steps and that are not important in inspecting the body of the poly gate silicide. At the completion of this processing step, the poly gate silicide is readily visible and is ready for inspection.

The advantage is the use of $XeF_2$ is that $XeF_2$ will convert to $Xe+2F$ after exposure to a high energy Ga beam. The F component will etch the oxide while the TiSix will not be etched by the F component.

The procedure for the $XeF_2$ etch is as follows:

introduce the $XeF_2$ gas introduce the high energy Ga beam at an energy of about 30 Kev and a current of about 150 pA the $XeF_2$ converts to $Xe+F_2$ after the Ga beam has been introduced the oxide is etched by the F component while the TiSix remains in place.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for inspecting and measuring depositions of silicide using a grounded Scanning Electron Microscope (SEM) inspection and measurement device, comprising the steps of:

providing a silicon substrate said substrate having been provided with one or more gate electrode structures whereby said gate electrode structures have been provided with salicided surfaces for electrical points of contact with the top surface of said gate electrode structures;

mounting said substrate on a rigid supporting surface; removing the materials overlying said salicided surfaces; and inspecting said salicided layer.

2. The method of claim 1 wherein said salicided surfaces contain TiSix.

3. The method of claim 1 wherein said mounting said substrate on a rigid supporting surface is:

cleaning the front side of the surface of said substrate whereby the front side is that side of said substrate that contains the active device areas of said substrate; and bonding said front side of said substrate to a clean surface of glass using G1 glue as the bonding medium.

4. The method of claim 1 wherein said removing the materials overlying said salicided surfaces is:

removing the silicon overlying said salicided surfaces; removing the oxide overlying said salicided surfaces; and removing the polysilicon overlying said salicided surfaces.

5. The method of claim 4 wherein said removing the silicon overlying said salicided surfaces is a Chemical Mechanical Polishing (CMP) process followed by a lapping process, comprising the steps of:

polishing the surface of said materials overlying said salicided surfaces using CMP thereby reducing the original silicon to a thickness of about 10,000 nm;

preparing a solution that contains choline hydroxide and DI water in the ratio of Choline: DI=1:10;

heating said solution to about 90 degrees C.;

dipping said substrate into said solution for a time between about 5 and 10 seconds; and soaking said substrate in water for a period of about 5 minutes thereby removing all remnants of silicon from said substrate.

6. The method of claim 5 whereby said choline hydroxide has the chemical composition of $HOCH_2CH_2N(CH)_3OH$ with an etch selectivity of 10000:1 for Si: $SiO_2$ and a typical etch rate of 25000 nm/hour.

7. The method of claim 4 wherein said removing the oxide overlying said salicided surfaces is dipping said substrate in slope for the duration of between about 3 and 5 seconds whereby said slope is a chemical compound containing HF, BOE, DI water and $CH_3COOH$.

8. The method of claim 4 wherein said removing the polysilicon overlying said salicided surfaces is dipping said substrate in choline.

9. A method for inspecting and measuring depositions of silicide using a grounded SEM inspection and measurement device, comprising the steps of:

providing a silicon substrate said substrate having been provided with one or more gate electrode structures whereby said gate electrode structures have been provided with salicided surfaces for electrical points of contact with the top surface of said gate electrode structures said salicided surface containing TiSi.;

mounting said substrate on a rigid supporting surface by cleaning the active side of the surface of said substrate and by bonding said front side of said substrate using G1 glue to a clean surface of glass;

removing the silicon overlying said salicided surfaces by polishing the surface of said materials overlying said salicided surfaces using CMP by furthermore preparing a solution that contains choline hydroxide and Di in the ratio of Choline: D1=1:10 by furthermore heating said solution to about 90 degrees C. by furthermore dipping said substrate into said solution for complete elimination of the silicon substrate by furthermore soaking said substrate in water for a period of about 5 minutes;

removing the oxide overlying said salicided surfaces by dipping said substrate in slope for the duration of between about 3 and 5 seconds whereby said slope is a chemical compound containing HF, BOE, DI water and $CH_3COOH$;

removing the polysilicon overlying said salicided surfaces by dipping said substrate in choline; and inspecting said salicided layer.

10. The method of claim 9 whereby said choline hydroxide has the chemical composition of $HOCH_2CH_2N(CH)_3OH$ with an etch selectivity of 10000:1 for $Si:SiO_2$ and a typical etch rate of 25000 nm/hour.

* * * * *